US009201777B2

(12) United States Patent
Hsu et al.

(10) Patent No.: US 9,201,777 B2
(45) Date of Patent: Dec. 1, 2015

(54) QUALITY OF SERVICE SUPPORT USING STACKED MEMORY DEVICE WITH LOGIC DIE

(71) Applicants: Lisa R. Hsu, Kirkland, WA (US); Gabriel H. Loh, Bellevue, WA (US); Bradford M. Beckmann, Redmond, WA (US); Michael Ignatowski, Austin, TX (US)

(72) Inventors: Lisa R. Hsu, Kirkland, WA (US); Gabriel H. Loh, Bellevue, WA (US); Bradford M. Beckmann, Redmond, WA (US); Michael Ignatowski, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 178 days.

(21) Appl. No.: 13/726,144

(22) Filed: Dec. 23, 2012

(65) Prior Publication Data

US 2014/0181428 A1  Jun. 26, 2014

(51) Int. Cl.
*G06F 12/00* (2006.01)
*G06F 12/02* (2006.01)

(52) U.S. Cl.
CPC ............ *G06F 12/00* (2013.01); *G06F 12/0246* (2013.01)

(58) Field of Classification Search
CPC ............................ G06F 12/0246; G06F 12/00
See application file for complete search history.

(56) References Cited

U.S. PATENT DOCUMENTS

| 6,189,065 | B1 | 2/2001 | Arndt et al. |
| 6,519,674 | B1 | 2/2003 | Lam et al. |
| 7,477,535 | B2 | 1/2009 | Lahtinen et al. |
| 7,796,446 | B2 | 9/2010 | Ruckerbauer et al. |
| 7,930,446 | B2 | 4/2011 | Kesselman et al. |
| 8,233,303 | B2 | 7/2012 | Best et al. |
| 8,356,138 | B1 | 1/2013 | Kulkarni et al. |
| 8,423,789 | B1 | 4/2013 | Poo et al. |
| 8,451,014 | B2 | 5/2013 | Black et al. |
| 8,519,739 | B1 | 8/2013 | Leon |
| 8,546,955 | B1 | 10/2013 | Wu |
| 8,700,951 | B1 | 4/2014 | Call et al. |
| 8,778,734 | B2 | 7/2014 | Metsis |
| 2004/0153902 | A1 | 8/2004 | Machado et al. |
| 2006/0164882 | A1 | 7/2006 | Norman |
| 2008/0066302 | A1 | 3/2008 | Chung |
| 2008/0320346 | A1 | 12/2008 | Lin |
| 2009/0017580 | A1 | 1/2009 | Smith |
| 2009/0055596 | A1 | 2/2009 | Wallach et al. |

(Continued)

OTHER PUBLICATIONS

U.S. Appl. No. 13/328,393, filed Dec. 16, 2011, entitled "Memory Architecture for Read-Modify-Write Operations".

(Continued)

*Primary Examiner* — Hiep Nguyen

(57) ABSTRACT

A die-stacked memory device implements an integrated QoS manager to provide centralized QoS functionality in furtherance of one or more specified QoS objectives for the sharing of the memory resources by other components of the processing system. The die-stacked memory device includes a set of one or more stacked memory dies and one or more logic dies. The logic dies implement hardware logic for a memory controller and the QoS manager. The memory controller is coupleable to one or more devices external to the set of one or more stacked memory dies and operates to service memory access requests from the one or more external devices. The QoS manager comprises logic to perform operations in furtherance of one or more QoS objectives, which may be specified by a user, by an operating system, hypervisor, job management software, or other application being executed, or specified via hardcoded logic or firmware.

24 Claims, 4 Drawing Sheets

(56) References Cited

U.S. PATENT DOCUMENTS

| | | | |
|---|---|---|---|
| 2009/0103345 A1* | 4/2009 | McLaren et al. | 365/64 |
| 2009/0190404 A1 | 7/2009 | Roohparvar | |
| 2009/0313483 A1 | 12/2009 | Ranade | |
| 2010/0005118 A1 | 1/2010 | Sezer | |
| 2010/0008058 A1 | 1/2010 | Saen et al. | |
| 2010/0070696 A1 | 3/2010 | Blankenship | |
| 2010/0070782 A1 | 3/2010 | Majewski et al. | |
| 2010/0157644 A1* | 6/2010 | Norman | 365/51 |
| 2010/0161918 A1 | 6/2010 | Norman | |
| 2010/0167100 A1 | 7/2010 | Moore et al. | |
| 2011/0231739 A1 | 9/2011 | Kim | |
| 2012/0023376 A1 | 1/2012 | Jeddeloh | |
| 2012/0079176 A1 | 3/2012 | Sun et al. | |
| 2012/0104578 A1 | 5/2012 | Hu et al. | |
| 2012/0130983 A1 | 5/2012 | Ryan et al. | |
| 2012/0204073 A1 | 8/2012 | Whetsel | |
| 2012/0273782 A1 | 11/2012 | Goel et al. | |
| 2012/0290793 A1 | 11/2012 | Chung et al. | |
| 2013/0031330 A1 | 1/2013 | Jones et al. | |
| 2013/0042060 A1 | 2/2013 | Marukame et al. | |
| 2013/0086353 A1 | 4/2013 | Colgrove et al. | |
| 2013/0257481 A1 | 10/2013 | Metsis | |
| 2013/0292840 A1 | 11/2013 | Shoemaker et al. | |
| 2014/0013169 A1 | 1/2014 | Kobla et al. | |
| 2014/0085959 A1* | 3/2014 | Saraswat et al. | 365/63 |
| 2014/0108891 A1 | 4/2014 | Strasser et al. | |
| 2014/0173113 A1* | 6/2014 | Vemuri et al. | 709/226 |

OTHER PUBLICATIONS

U.S. Appl. No. 13/567,945, filed Aug. 6, 2012, entitled "Stacked Memory Device With Metadata Mangement".
U.S. Appl. No. 13/567,958, filed Aug. 6, 2012, entitled "Stacked Memory Device With Helper Processor".
U.S. Appl. No. 13/726,142, filed Dec. 23, 2012, entitled "Die-Stacked Device With Partitioned Multi-Hop Network".
U.S. Appl. No. 13/726,143, filed Dec. 23, 2012, entitled "Die-Stacked Memory Device Providing Data Translation".
U.S. Appl. No. 13/726,145, filed Dec. 23, 2012, entitled "Die-Stacked Memory Device With Reconfigurable Logic".
U.S. Appl. No. 13/726,146, filed Dec. 23, 2012, entitled "Cache Coherency Using Die-Stacked Memory Device With Logic Die".
David Patterson et al., "FP 14.1: Intelligent RAM (IRAM): Chips That Remember & Compute", 1997 IEEE International Solid-State Circuits Conference, Feb. 7, 1997, 2 pages.
Gabriel H. Loh, "3D-Stacked Memory Architectures for Multi-Core Processors", ISCA '08 Proceedings of the 35th Annual International Symposium on Computer Architecture, Jun. 2008, pp. 453-464.
J. Thomas Pawlowski, "Hybrid Memory Cube (HMC)", Micron Technologies, Aug. 4, 2011, 24 pages.
Intel Platform Brief "Intel Atom Processor E6x5C Series-Based Platform for Embedded Computing", http://newsroom.intel.com/servlet/jiveservlet/download/1512-31-3257/ProductBrief-IntelAtomProcessor_E600C_series_v2.pdf, Jan. 2010, 4 pages.
Stretch, Inc. Configurable Processors, http://www.stretchinc.com, Accessed Apr. 2, 2013, 1 page.
International Search Report and Written Opinion correlating to PCT/US2013/053599 dated Dec. 9, 2013, 8 pages.
International Search Report and Written Opinion correlating to PCT/US2013/053596 dated Dec. 9, 2013, 8 pages.
International Search Report and Written Opinion correlating to PCT/US13/075956 dated May 9, 2014, 13 pages.
Non-Final Office Action mailed May 14, 2014 for U.S. Appl. No. 13/726,145, 23 pages.
Non-Final Office Action mailed Nov. 7, 2014 for U.S. Appl. No. 13/726,142, 20 pages.
Final Office Action mailed Oct. 31, 2014 for U.S. Appl. No. 13/567,945, 23 pages.
Final Office Action mailed Aug. 11, 2014 for U.S. Appl. No. 13/567,958, 27 pages.
Notice of Allowance mailed Aug. 25, 2014 for U.S. Appl. No. 13/726,145, 22 pages.
Non-Final Office Action mailed Jun. 20, 2014 for U.S. Appl. No. 13/567,945, 31 pages.
Nathan Brookwood, "AMD Fusion Family of APUs: Enabling a Superior, Immersive PC Experience", AMD White Paper: AMD Fusion Family of APUs, Mar. 2010, 8 pages.
"How Computers Work: The CPU and Memory", <http://homepage.cs.url.edu/faculty/wolfe/book/Readings/Reading04.htm> Feb. 1, 2002, 1 page.
N.S. Matlo, "Introduction to Microcoded Implementation of a CPU Architecture", <http://www.cs.ucsb.edu/~chong/154/Tan.pdf> Jan. 21, 1997, 12 pages.
Lixin Tao, "Interrupt Processing", <http://csis.pace.edu/~lixin/teaching/cs371/interrupt.pdf> Sep. 2002, 3 pages.
Shawn Hargreaves, "An elf in a box", <http://blogs.msdn.corn/b/shawnhar/archive/2008/03/31/an-elf-in-a-box.aspx> Mar. 31, 2008, 5 pages.
Chris Rawson, "Mac 101: Integrated versus discrete graphics", <http://www.tuaw.corn/2010/05/14/mac-101-integrated-versus-discrete-graphics/> May 14, 2010, 2 pages.
Matthew Hogan, "Silicon Interposers: building blocks for 3D-Ics", <http://electroig.com/blog/2011/06/silicon-interposers-building-blocks-for-3d-ics/> Jun. 14, 2011, 6 pages.
Nigel Jacob, "Offloading IDS Computation to the GPU", 22nd Annual Computer Security Applications Conference (ACSAC'06), <http://www.acsac.org/2006/papers/74.pdf> Dec. 21, 2006, 10 pages.
Laura Tiffany, "How Many Computer Processors Do You Need?" <http://www.allbusiness.com/computing-information-technology/parallel-computing/12603535-1/html> Aug. 7, 2009, 2 pages.
QNX "Processes and Threads", <http://www.qnx.com/developers/docs/6.4.0/neutrino/getting_started/s1_procs.html> May 29, 2009, 20 pages.
Eric Chan, "GPU Gems 2" <http://http.developer.nvidia.com/GPUGems2_chapter22.html> Apr. 15, 2005, Chapter 22, 11 pages.
Yi Yang et al. "CPU-assisted GPGPU on fused CPU-GPU architectures", IEEE, Feb. 2012, 12 pages.
Debra Cook et al. "Secret Key Cryptography Using Graphics Cards", Columbia University Technical Report, Jan. 14, 2004, 14 pages.
Matthew Hogan et al. "Robust Verification of 3D-Ics: Pros, Cons and Recommendations", IEEE, Aug. 21, 2009, 6 pages.
Carlos Carvalho, "The Gap Between Processor and Memory Speeds", ICCA, 2002, 8 pages.
Christianto C. Liu et al. "Bridging the Processor-Memory Performance Gap with 3D IC Technology", IEEE vol. 22, Issue 6, Nov. 21, 2005, 9 pages.
Jon Stokes "Ask Ars: what is a CPU thread?" Ministry of Innovation of Technology, Apr. 12, 2011, 2 pages.
"Computer-System Operation", <http://siber.cankaya.edu.tr/operatingsystems/ceng328/node15.html> Feb. 14, 2011, 4 pages.
Non-Final Office Action mailed Dec. 20, 2013 for U.S. Appl. No. 13/567,945, 13 pages.
Non-Final Office Action mailed Feb. 27, 2014 for U.S. Appl. No. 13/567,958, 24 pages.
U.S. Appl. No. 13/726,145, filed May 18, 2015, entitled "Die-Stacked Device with Partitioned Multi-Hop Network".
Final Office Action mailed Apr. 17, 2014 for U.S. Appl. No. 13/567,945, 32 pages.
Non-final Office Action mailed Jun. 18, 2015 for U.S. Appl. No. 13/941,791, 52 pages.
Notice of Allowance mailed Feb. 20, 2015 for U.S. Appl. No. 13/726,142, 19 pages.
Notice of Allowance mailed Jun. 18, 2015 for U.S. Appl. No. 13/726,146, 29 pages.
Notice of Allowance mailed May 11, 2015 for U.S. Appl. No. 13/726,143, 24 pages.
U.S. Appl. No. 14/551,147, filed Nov. 24, 2014, entitled "Die-Stacked Memory Device With Reconfigurable Logic".
Non-Final Office Action mailed Dec. 17, 2014 for U.S. Appl. No. 13/726,143, 13 pages.
Non-Final Office Action mailed Dec. 23, 2014 for U.S. Appl. No. 13/726,146, 14 pages.
NPL Non-Final Office Action mailed Jan. 15, 2015 for U.S. Appl. No. 13/941,791, 33 pages.

* cited by examiner

QUALITY OF SERVICE SUPPORT USING STACKED MEMORY DEVICE WITH LOGIC DIE

BACKGROUND

1. Field of the Disclosure

The present disclosure generally relates to processing systems and, more particularly, to die-stacked memory devices.

2. Description of the Related Art

Processing systems generally implement system memory separately from the devices implementing processors, input/output (I/O) components, and other components. The system memory typically is shared among the devices, and thus processing efficiency of the processing system may be impacted by excessively low memory bandwidth or excessively high memory access latency during times of high collective utilization of the system memory by the devices. Conventional techniques to provide certain quality of service (QoS) levels for memory accesses at the system level typically rely on some form of coordination among the devices sharing the system memory, which can unnecessarily complicate the design of the processing system.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
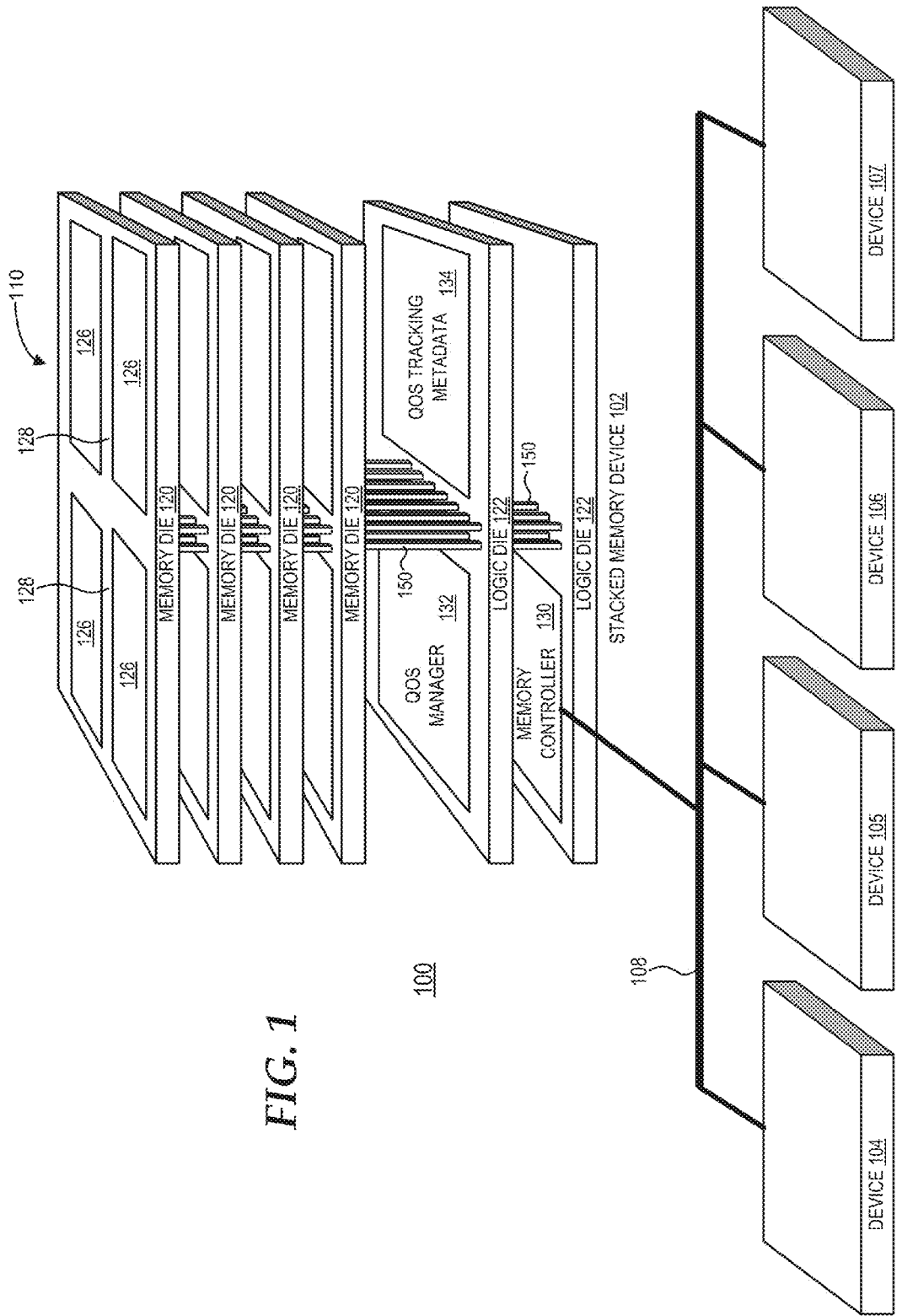
FIG. 1 is a diagram illustrating an exploded perspective view of a vertical-stack configuration of a processing system implementing a die-stacked memory device with a logic die implementing a hardware quality of service (QoS) manager in accordance with some embodiments.

FIGS. 1-5 illustrate example techniques for improved processing efficiency and decreased power consumption in a processing system through the use of a die-stacked memory device implementing an integrated QoS manager to provide centralized QoS functionality in furtherance of one or more specified QoS objectives for the sharing of the memory resources by components (referred to herein as "sharers") of the processing system. The die-stacked memory device includes a set of one or more stacked memory dies and a set of one or more logic dies. The one or more logic dies implement hardware logic for a memory controller and the QoS manager. The memory controller is coupled to the memory cell circuitry and is coupleable to one or more devices external to the set of one or more stacked memory dies and set of logic dies via one or more corresponding interfaces. The memory controller operates to service memory access requests from the one or more external devices. The QoS manager comprises logic to perform one or more operations in furtherance of one or more QoS objectives, which may be specified by a user, by an operating system, hypervisor, job management software, or other application being executed, or specified via hard-coded logic or firmware. These QoS objectives typically are not guarantees of any particular QoS metric, but rather goals which the QoS manager strives to achieve.

To facilitate QoS objectives, in some embodiments, the tracking of certain QoS tracking metadata, such as historical memory utilization metrics pertaining to use of the memory for one or more categories, such as on a per-sharer basis or a per-sharer-class basis, on a per-device basis or per-device-class basis, on a per-interface basis (in instances whereby the memory controller has multiple interfaces to the external devices), or on a per-memory-access-type or priority-type basis. The QoS manager maintains the QoS tracking metadata in a storage array, whereby the QoS manager monitors the memory controller and updates the QoS tracking metadata in response to the memory access operations performed by the memory controller. The memory utilization metrics may reflect bandwidth utilization metrics, such as, for example, a number or frequency of memory accesses recently processed at the die-stacked memory device or a number or frequency of memory access requests recently received at the die-stacked memory device. The memory utilization metrics may reflect certain latency metrics, such as a maximum, minimum, or average memory access latencies recently experienced at the die-stacked memory device. The memory utilization metrics may reflect certain power consumption metrics, such as the maximum, minimum, or average power consumed in order to perform memory accesses over a specified period or other specified count.

In some embodiments, enforcement of a QoS objective is managed as a higher-level function by one or more software components executed external to the die-stacked memory device, such as by an operating system, a hypervisor, or a job scheduling application executed at one of the external devices. In such instances, the operations performed by the QoS manager may be limited to maintaining the QoS tracking metadata based on monitored activities of the memory controller and to transmitting at least a portion of the QoS tracking metadata to the component handling the enforcement of QoS objectives in response to a query for this information from the component. In other embodiments, the QoS manager plays a primary role in the enforcement of the QoS configuration by performing operations to manage access to the memory controller in furtherance of specified QoS objectives. To illustrate, to achieve certain QoS objectives the QoS manager may handle the ordering or other scheduling of memory access requests to be processed by the memory controller. The QoS manager also may perform various operations to implement memory access backpressure (that is, the selective rejection of memory access requests from the external devices). Moreover, as the transmission of the results of memory accesses can consume memory-related resources, such as the bandwidth of the memory-device interconnect, the QoS manager can perform various operations related to ordering or other scheduling of the return of the results of memory accesses to the external devices that initiated the memory accesses. Further, the operations performed by the QoS manager in furtherance of a specified QoS objective can include selectively reserving or managing the occupancy of certain memory-related resources for any of a variety of classifications, such as on a per-sharer, per-device, per-device-class, per-access-type, or per-interface basis.

Due to the co-location and tight integration between the QoS manager and the memory dies, the QoS manager can operate to facilitate the implementation of QoS objectives without requiring the complex coordination between devices typically found in conventional memory QoS implementations. Moreover, the offloading of QoS-related operations to the die-stacked memory device permits the external devices to focus on other tasks, thereby increasing the overall processing throughput of the system.

FIG. 1 illustrates a processing system 100 in accordance with some embodiments. The processing system 100 can comprise any of a variety of computing systems, including a notebook or tablet computer, a desktop computer, a server, a network router, switch, or hub, a computing-enabled cellular phone, a personal digital assistant, and the like. In the depicted example, the processing system 100 includes a die-stacked memory device 102 implemented as system memory or other memory shared by a plurality of devices, such as devices 104, 105, 106, and 107. In the illustrated example, the devices 104-107 are coupled to the die-stacked memory device 102 via a single inter-device interconnect 108. However, in other embodiments, each device may be coupled to the die-stacked memory device 102 via a separate interconnect or subsets of the devices may be coupled to the die-stacked memory device 102 via corresponding separate interconnects. The processing system 100 also can include a variety of other components not illustrated in FIG. 1, such as one or more display components, storage devices, input devices (e.g., a mouse or keyboard), and the like.

In some embodiments, the devices 104-107 are implemented individually or in combination as one or more integrated circuit (IC) packages and the die-stacked memory device 102 is implemented as an IC package 110 separate from the IC packages implementing the devices 104-107. In other embodiments, some or all of the devices 104-107 and the die-stacked memory device 102 are implemented as separate sets of dies connected via an interposer in the same IC package 110. In either instance, the term "external device," as used herein, refers to a device not implemented in (that is, "external to") the dies that compose the die-stacked memory device 102. As such, the devices 104-107 are referred to herein as "external devices 104-107."

The external devices of the processing system 100 can include any of a variety of types of devices that can share memory, including, but not limited to, processors or processor cores (which may include central processing units, graphics processing units, digital signal processors, and the like), input/output (I/O) controllers, network interface controllers (NICs), disk direct memory access (DMA) engines, and the like. The one or more inter-device interconnects 108 connecting the external devices 104-107 and the die-stacked memory device 102 can be implemented in accordance with any of a variety of conventional interconnect or bus architectures, such as a Peripheral Component Interconnect-Express (PCI-E) architecture, a HyperTransport architecture, a QuickPath Interconnect (QPI) architecture, and the like. Alternatively, the interconnect 108 can be implemented in accordance with a proprietary bus architecture. The interconnect 108 includes a plurality of conductors coupling transmit/receive circuitry of corresponding external devices with transmit/receive circuitry of the die-stacked memory device 102. The conductors can include electrical conductors, such as printed circuit board (PCB) traces or cable wires, optical conductors, such as optical fiber, or a combination thereof.

The die-stacked memory device 102 implements any of a variety of memory cell architectures, including, but not limited to, volatile memory architectures such as dynamic random access memory (DRAM) and static random access memory (SRAM), or non-volatile memory architectures, such as read-only memory (ROM), flash memory, ferroelectric RAM (F-RAM), magnetoresistive RAM, and the like. Moreover, the die-stacked memory device 102 can incorporate combinations of memory technologies, such a combination of memory die implementing DRAM and memory die implementing SRAM. For ease of illustration, the example implementations of the die-stacked memory device 102 are described herein in the example, non-limiting context of a DRAM architecture.

As illustrated by the exploded perspective view of FIG. 1, the die-stacked memory device 102 comprises a set of one or more stacked memory dies 120 and a set of one or more logic dies 122. Each memory die 120 comprises memory cell circuitry 126 implementing bitcells in accordance with the memory architecture of the die-stacked memory device 102 and the peripheral logic circuitry 128 implements the logic and other circuitry to support access and maintenance of the bitcells in accordance with this memory architecture. To illustrate, DRAM typically is composed of a number of ranks, each rank comprising a plurality of banks, and each bank comprising a matrix of bitcells set out in rows and columns. Accordingly, in some embodiments, each memory die 120 may implement one rank (and thus the banks of bitcells for the corresponding rank). In other embodiments, the DRAM ranks each may be implemented across multiple memory dies 120. For example, the die-stacked memory device 102 may implement four ranks, each rank implemented at a corresponding quadrant of each of the memory dies 120. In either implementation, to support the access and maintenance of the DRAM bit cells, the peripheral logic circuitry 128 may include, for example, line drivers, bitline/wordline precharging circuitry, refresh circuitry, row decoders, column select logic, row buffers, sense amplifiers, and the like.

The one or more logic dies 122 implement hardware logic to facilitate access to the memory of the die-stacked memory device 102. This logic includes, for example, a memory controller 130, built-in self-test (BIST) logic (not shown), and the like. The memory controller 130 includes circuitry to facilitate the reception, buffering, and servicing of memory access requests, this circuitry including, for example, receivers and line drivers, memory request buffers, scheduling logic, row/column decode logic, refresh logic, data-in and data-out buffers, clock generators, and the like. The memory controller 130 further comprises an interface for each inter-device interconnect 108 implemented in the processing system 100, each interface comprising a physical layer interface (PHY) coupleable to the conductors of the corresponding interconnect, and thus coupleable to the external devices associated with that interconnect. To illustrate, FIG. 1 depicts an example whereby the external devices 104-107 are connected to the memory controller 130 via a single interconnect 108, and thus the memory controller 130 would include a single interface. In an alternative example implementation, the external devices 104 and 105 could be coupled to the memory controller 130 via one interconnect and the external devices 106 and 107 could be coupled to the memory controller 130 via a separate interconnect. In this example, the memory controller 130 thus would include two interfaces, one for each interconnect.

The memory controller 130 supports the utilization of the memory cell circuitry 126 as system memory or other memory shared within the processing system 100. Those components sharing the die-stacked memory device 102 as a shared memory are referred to herein as "sharers." The sharers of the die-stacked memory device 102 can be identified as such at one or more levels, such as at a socket level, a device level, at the processor or processor core level, at a hypervisor level, at a virtual machine level, at an operating system level, at a thread level, or at any combination of the foregoing levels. As one sharer's use of the shared memory may interfere with another sharer's use, the processing system 100 employs QoS mechanisms to handle such conflicts and to improve the overall processing efficiency of the processing system 100. Thus, in addition to implementing logic to facilitate access to the memory implemented by the memory dies 120, one or more logic dies 122 implement a QoS manager 132 to perform operations in support of one or more specified QoS objectives for sharing the memory implemented by the memory dies 120. To this end, the QoS manager 132 includes, or has access to, a storage array 134 to store QoS tracking metadata, as described in greater detail herein. The storage array 134 may be implemented in the memory cell circuitry 126, in storage elements (e.g., registers, caches, or content addressable memories) located at one or more of the logic dies 122, in a non-volatile memory, such as flash memory, or in a combination thereof.

In the illustrated example, the QoS manager 132 and the memory controller 130 are implemented on different logic dies 122. In other embodiments, the memory controller 130 and the QoS manager 132 may be implemented on the same logic die 122. Moreover, in some embodiments, one or both of the memory controller 130 and the QoS manager 132 may be implemented across multiple logic dies. To illustrate, the memory controller 130 and the logic circuitry of the QoS manager 132 may be implemented at one logic die 122 and certain storage elements of the QoS manager 132 (e.g., a cache or content addressable memory) may be implemented at another logic die 122.

In some embodiments, the processing system 100 provides for QoS objectives to be implemented via high-level software executed in the processing system 100. For example, the provision of QoS mechanisms may be managed by an operating system, hypervisor, thread manager or job scheduling manager. To this end, the executed high-level software coordinates access to the die-stacked memory device 102 among the sharers. The high-level software typically benefits from access to various QoS metrics to properly implement the QoS mechanisms. These QoS metrics can include bandwidth-related metrics, such as the maximum, minimum, or mean number or frequency of memory accesses, latency-related metrics, such as the maximum, minimum, or mean latency between receipt of memory access requests and the provision of the results of the corresponding memory accesses to the requesting sharers, or power-related metrics, such as the power consumed on, for example, a per-sharer basis. In such implementations, the QoS manager 132 may operate primarily to maintain the QoS tracking metadata in the storage array 134 by tracking various QoS utilization metrics through the monitoring of the activity of the memory controller 130. The co-location of the QoS manager 132 and the stacked set of memory dies 120 permits the QoS manager 132 to maintain this information more efficiently than a configuration whereby an external device attempts to collate this information. When the higher-level software requires certain QoS tracking metadata to implement a QoS operation, the higher-level software issues a request to the QoS manager 132 though the memory controller 130. In response to the request, the QoS manager 132 accesses the requested QoS tracking metadata from the storage array 134 and provides it to the higher-level software.

In some embodiments, management of the QoS objectives is vested in the QoS manager 132 such that the QoS manager 132 is the primary manager of access to the shared memory.

In this arrangement, the QoS manager 132 performs operations based on the memory utilization metrics represented by the stored QoS tracking metadata and based on the specified QoS objectives. In some embodiments, the QoS objectives are statically defined in that they are configured during the design, manufacture, or initial release of the die-stacked memory device 100. To illustrate, the die-stacked memory device 102 may employ fuses, one-time-programmable registers, or hardcoded logic to provide internal values or other signaling to the QoS manager 132 that specifies certain QoS objectives. In other embodiments, the QoS objectives may be dynamically specified by an end user or by an application, operating system, hypervisor, or other software. For example, the QoS manager 132 may utilize a set of control registers or a region of the shared memory that is accessible to software and which is used to store configuration data representative of specified QoS objectives. In other embodiments, the configuration data representative of specified QoS objectives may be provided to the QoS manager 132 via a specific QoS command transmitted via the inter-device interconnect or via a side-band interconnect. The logic implementing the QoS manager 132 is configured to select and perform various arbitration-related operations in response to the configuration data so received and stored.

The QoS objectives are directed to arbitrating usage among the sharers to achieve certain goals, such as a minimum bandwidth or maximum latency guaranty, fairness among the sharers (on the basis of one or more of bandwidth, latency, or power consumption), maximizing throughput, minimizing power consumption per unit time, and the like. As such, the QoS objectives typically are reflected by at least one of three primary metrics: bandwidth; latency; and power consumption. The bandwidth metric can reflect one or both of a number of memory access requests serviced by the die-stacked memory device 102 per unit time, or a number of bytes or other measure of data read from and/or written to the die-stacked memory device 102. The latency metric reflects an amount of time that lapses between the submission of a memory access request by a sharer to the die-stacked memory device 102 and a return of a result of the memory access represented by the memory access request to the requesting sharer. The result can include, for example, requested data or confirmation that the memory access has been completed. The power consumption metric reflects a measure of power consumed by the processing system 100 in order to perform the memory access represented by a memory access request submitted by the sharer. This metric typically is preset based on empirical analysis or simulation at design time, and the particular power consumption value attributed to a given memory access request typically depends on any of a variety of factors, such as the type of memory access request, the size of the memory block affected by the memory access, the sharer issuing the memory access request, and the like. As a simple example in a non-volatile memory architecture context, read-type memory access requests may be assigned a power consumption value of 1 unit (e.g., picowatts), clear-type memory access requests may attributed a power consumption value of 3 units, and set-type memory access requests may be attributed a power consumption value of 2 units. The bandwidth, latency, and power-consumption metrics may be presented using any of a variety of statistical representations, including a maximum, minimum, mean (or average), median, maximum average, minimum average, and the like.

Moreover, the QoS objectives can be directed to various subsets found within the sharers, as identified by sharer classification, sharer features, or other considerations. For example, a QoS objective may be set for a particular QoS class, such as a QoS class defined as devices of a certain type (e.g., a processor-type device), a QoS class defined as sharers of a certain type (e.g., threads assigned a certain priority), or, in the event that multiple interconnect interfaces are implemented at the memory controller 130, a QoS class defined as sharers connected to the die-stacked memory device 102 via a particular interconnect interface, a QoS class defined as memory access requests having a specified priority, or a QoS class defined as memory access requests of a certain type (e.g., read-type memory access requests). As such, the one or more metrics represented by a QoS objective may be a statistical metric for the corresponding subset, such as a QoS objective setting a minimum bandwidth guarantee or maximum latency guarantee for a particular class of sharers.

Table 1 below provides a non-limiting list of various example QoS objectives that may be statically or dynamically configured for the QoS manager 132.

TABLE 1

Example QoS Objectives

| | | |
|---|---|---|
| Bandwidth-based: | Equal bandwidth | For all sharers |
| | | For a subset or class of sharers |
| | | For a memory access type |
| | | For a memory interface |
| | Guaranteed minimum bandwidth of X | For a subset or class of sharers |
| | | For a memory access type |
| | | For a memory interface |
| | Maximize throughput | For all sharers |
| | | For a subset or class of sharers |
| | | For a memory access type |
| | | For a memory interface |
| Latency-based: | Minimize average latency | For all sharers |
| | | For a subset or class of sharers |
| | | For a memory access type |
| | | For a memory interface |
| | Guaranteed maximum latency | For a subset or class of sharers |
| | | For a memory access type |
| | | For a memory interface |
| Power-based: | Equal power consumption | For all sharers |
| | | For a subset or class of sharers |
| | | For a memory access type |
| | | For a memory interface |
| | Guaranteed maximum power consumption of X | For a subset or class of sharers |
| | | For a memory access type |
| | | For a memory interface |

The QoS manager 132 may facilitate the specified QoS objectives through arbitration of the use of the resources of the die-stacked memory device 102. This arbitration can include any of a variety of operations, which may be directly implemented by the QoS manager 132, or which the QoS manager 132 may indirectly implement through configuration of the memory controller 130. One example arbitration operation is the manipulation of the ordering or scheduling of memory access requests to be serviced by the memory controller 130. The QoS manager 132 can manipulate the ordering or other scheduling of memory access requests either by directly controlling the ordering or other scheduling, or by indirectly controlling the ordering or other scheduling through the configuration of certain parameters used in the scheduling algorithm employed by the memory controller 130. To illustrate, to facilitate a QoS objective of equal bandwidth among a subset of sharers, the QoS manager 132 may implement (or configure the memory controller 130 to implement) a round-robin selection scheme for the sharers of this subset when selecting memory access requests to be processed by the memory controller 130.

Another example arbitration operation is the implementation of memory access request backpressure through selective rejection of memory access requests by the die-stacked memory device 102 so as to limit the number of memory access requests pending at the die-stacked memory device 102. For example, to facilitate a QoS objective of a guaranteed maximum latency for the sharers of a specified QoS class, the QoS manager 132 may reject (or configure the memory controller 130 to deny acceptance of) memory access requests from sharers not in the QoS class responsive to the QoS manager 132 dynamically determining, using the stored QoS tracking metadata, that the latency for memory access requests from the sharers of the QoS class have come within a certain threshold of the guaranteed maximum latency.

The servicing of a memory access request by the die-stacked memory device 102 often generates a result that is returned to the sharer that initiated the memory access request. This result can take the form of data requested by the sharer, or the form of acknowledgement information, such as a confirmation that the memory access requests was successfully completed, or if there was an error in processing the memory access request, an error code identifying the error. As the return of these results to the sharers consumes the bandwidth of the die-stacked memory device 102 and the inter-device interconnects, the return of these results can impact bandwidth, latency, and power-consumption metrics. Accordingly, the QoS manager 132 also may employ the manipulation of the order of the return of results of memory access requests in furtherance of a specified QoS objective. For example, to facilitate a QoS objective of a minimized latency for memory access requests from a certain device, the QoS manager 132 may manipulate the ordering of the return of results so that results that are to be returned to the identified device are prioritized over the return of results for other devices.

A sharer's use of the die-stacked memory device 102 also may be controlled through the control of the sharer's access to, or occupancy of, certain resources of the die-stacked memory device 102. Accordingly, the QoS manager 132 can control the reservation of certain resource of the die-stacked memory device 102 or otherwise manipulate resource occupancy management for the sharers to facilitate a QoS objective. For example, the memory controller 130 may employ a request buffer to buffer memory access requests from sharers, and a sharer's use of the die-stacked memory device 102 thus is controlled by controlling the number of buffer entries allocated to the sharer, or controlling the order in which memory access requests from the sharer are entered into the buffer. Accordingly, to provide for a certain bandwidth or latency metric for a sharer, the QoS manager 132 can reserve or otherwise set aside a certain number of buffer entries for memory requests from the sharer. Reservation of other resources, such as row-buffers, response buffers, other queues, and busses likewise may be controlled by the QoS manager 132 in furtherance of a specified QoS objective.

In the depicted implementation of FIG. 1, the die-stacked memory device 102 is implemented in a vertical stacking arrangement whereby power and signaling are transmitted between the logic dies 122 and the memory dies 120 using dense through silicon vias (TSVs) 150 or other vertical interconnects. Although FIG. 1 depicts the TSVs 150 in a set of centralized rows, the TSVs 150 instead may be more dispersed across the floorplans of the dies. Note that FIG. 1 provides an exploded-view representation of the dies 120 and 122 to permit illustration of the TSVs 150 and the components of the dies 120 and 122. In implementation, each of the dies may overly and be in contact with the preceding die.

The die-stacked memory device 102 may be fabricated using any of a variety of 3D integrated circuit fabrication processes. In one approach, the dies 120 and 122 each are implemented as a separate substrate (e.g., bulk silicon) with active devices and one or more metal routing layers formed at an active surface. This approach can include a wafer-on-wafer process whereby a wafer comprising a matrix of dies is fabricated and thinned, and TSVs are etched through the bulk silicon. Multiple wafers are then stacked to achieve the illustrated layer configuration (e.g., a stack of four wafers comprising memory circuitry dies for the four memory dies 120 and a wafer comprising the logic die for the logic die 122), aligned, and then joined via thermocompression. The resulting stacked wafer set is singulated to separate the individual 3D IC devices, which are then packaged. In a die-on-die process, the wafer implementing each corresponding die is first singulated, and then the dies are separately stacked and joined to fabricate the 3D IC devices. In a die-on-wafer approach, wafers for one or more dies are singulated to generate the dies, and these dies are then aligned and bonded to the corresponding die areas of another wafer, which is then singulated to produce the individual 3D IC devices. One benefit of fabricating the dies 120 and 122 as dies on separate wafers is that a different fabrication process can be used to fabricate the logic dies 122 than that used to fabricate the memory dies 120. Thus, a fabrication process that provides improved performance and lower power consumption may be used to fabricate the logic dies 122 (and thus provide faster and lower-power interface logic and circuitry for the QoS manager 132), whereas a fabrication process that provides improved cell density and improved leakage control may be used to fabricate the memory dies 120 (and thus provide more dense, lower-leakage bitcells for the stacked memory).

In another approach, the dies 120 and 122 are fabricated using a monolithic 3D fabrication process whereby a single substrate is used and each die is formed on a preceding die using a die transfer process, such as an ion-cut process. The die-stacked memory device 102 also may be fabricated using a combination of techniques. For example, the logic dies 122 may be fabricated using a monolithic 3D technique, the memory dies may be fabricated using a die-on-die or wafer-on-wafer technique, or vice versa, and the resulting logic die stack and memory die stack then may be bonded to form the 3D IC device for the die-stacked memory device 102.

Figure 2:
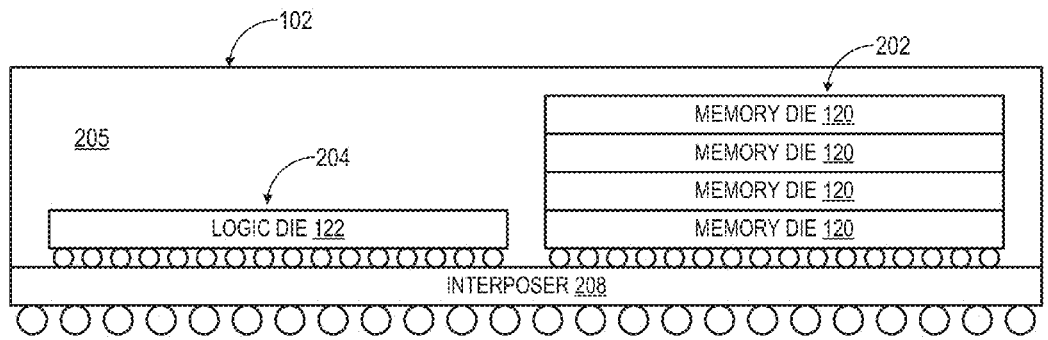
FIG. 2 is a diagram illustrating a cross-section view of a side-split configuration of the processing system of FIG. 1 in accordance with some embodiments.

FIG. 2 illustrates a cross-section view of an alternative implementation of the die-stacked memory device 102 in accordance with some embodiments. Rather than implement a vertical stack implementation as shown in FIG. 1 whereby the one or more logic dies 122 are vertically aligned with the memory dies 120, the die-stacked memory device 102 instead may implement the side-split arrangement of FIG. 2 whereby the stacked memory dies 120 are implemented as an IC device 202 and the one or more logic dies 122 are implemented as a separate IC device 204, and the IC devices 202 and 204 (and thus the logic dies 122 and the memory dies 120) are connected via an interposer 208. The interposer 208 can comprise, for example, one or more levels of silicon interposers, a printed circuit board (PCB), or a combination thereof. Although FIG. 2 illustrates the stacked memory dies 120 together implemented as a single IC device 202, the stacked memory dies 120 instead may be implemented as multiple IC devices 202, with each IC device 202 comprising one or more memory dies 120. Likewise, the logic dies 122 may be implemented as a single IC device 204 or as multiple IC devices 204. The one or more IC devices 202, the one or more IC devices 204, and the unifying interposer 208 are packaged as an IC package 205 representing the die-stacked memory device 102.

Figure 3:
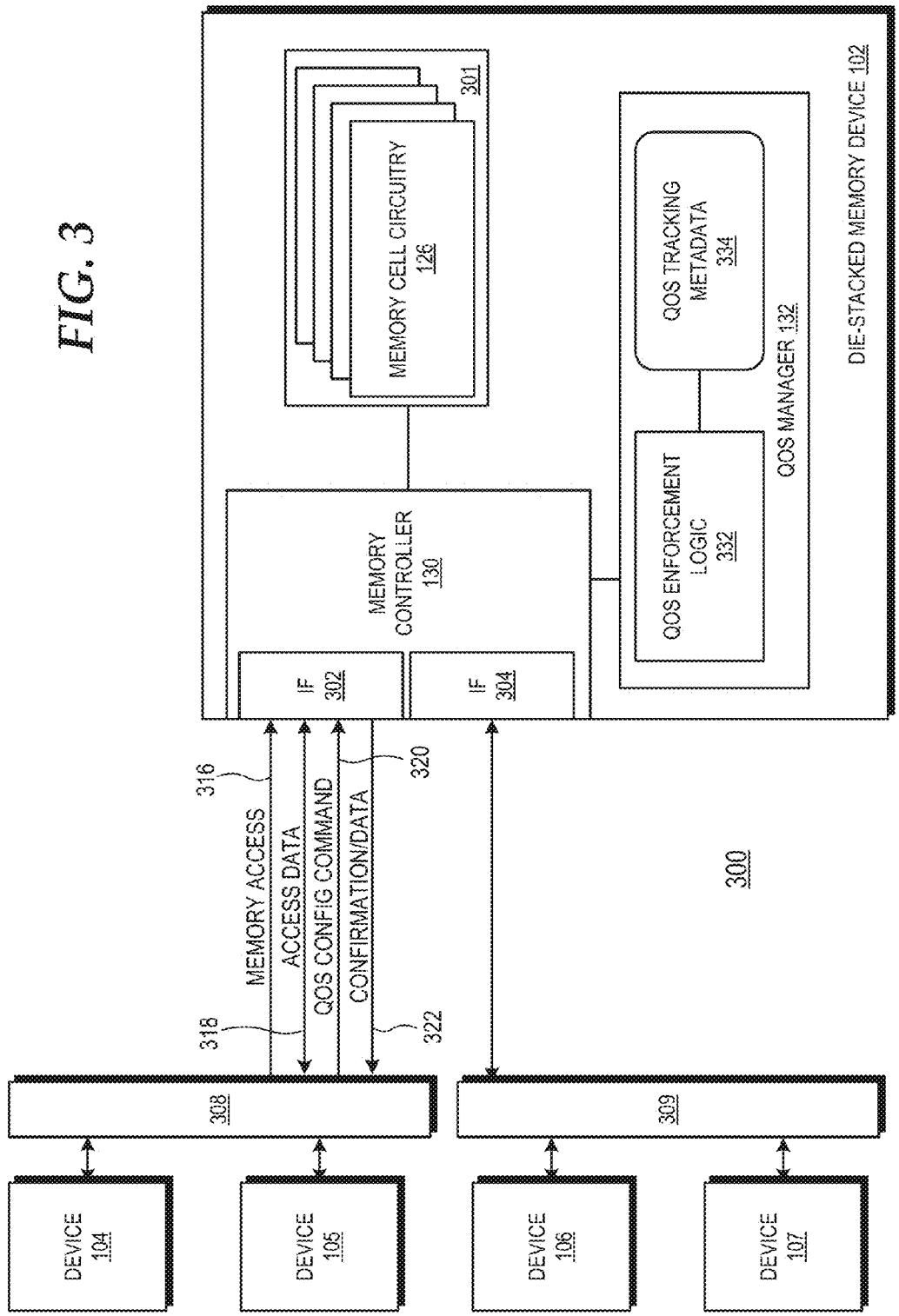
FIG. 3 is a block diagram illustrating the processing system of FIG. 1 in greater detail in accordance with some embodiments.

FIG. 3 illustrates a processing system 300 in block diagram form in accordance with some embodiments. The processing system 300 represents a multiple interconnect variation of the processing system 100 of FIG. 1 whereby the external devices 104 and 105 are coupled to an interface 302 of the memory controller 130 via an interconnect 308 and the external devices 106 and 107 are coupled to an interface 304 of the memory controller 130 via a separate interconnect 309.

In operation, the die-stacked memory device 102 functions as a system memory for storing data on behalf of other system components. To this end, the die-stacked memory device 102 implements a shared memory 301 represented by multiple stacked dies of memory cell circuitry 126. In a memory access operation, an external device issues a memory access request 316 by manipulating its memory interface to transmit address signaling and, if the requested memory access is a write access, data signaling via the corresponding interconnect to the die-stacked memory device 102. The corresponding interface receives the signaling, and the memory access request represented by the signaling is buffered at the memory controller 130 and scheduled for servicing. When the memory access request is selected based on a scheduled order or other selection algorithm, the memory controller accesses the memory cell circuitry 126 to fulfill the memory access operation represented by the memory access request. A result of the memory access is buffered at the memory controller 130 and scheduled for return to the requesting device. In the event that the memory access request 316 is a write-type or clear-type access, the result can include a completion confirmation or other completion status. In the event that the memory access request 316 is a read-type request, the result can be the requested data accessed from the location of the shared memory 301 corresponding to the signaled address. When a result is selected based on a scheduled order or other selection algorithm, the memory controller 130 transmits the result to the requesting device as result signaling 318.

As described above, various aspects of the servicing of memory access requests can be managed to achieve specified QoS objectives pertaining to bandwidth, latency, power consumption, and the like. For example, the memory controller 130 can be configured to apply backpressure by selectively rejecting memory access requests so as to limit the number of memory access requests pending at the memory controller 130. The ordering or other scheduling of the memory access requests for processing may be manipulated to achieve specified QoS objectives. Likewise, the ordering or other scheduling of the return of memory access results can be manipulated for specified QoS objectives. Moreover, the reservation or occupancy of certain memory resources, such as the queues used to buffer memory access requests or the row buffers of the memory controller 130, may be managed for specified QoS objectives.

In support of the QoS management of the sharing of the die-stacked memory device 102, the QoS manager 132 includes QoS enforcement logic 332 that monitors the activity of the memory controller 130 and maintains QoS tracking metadata reflective of this monitored activity in a storage array 334. The storage array 334 may be located at the shared memory 301, or it may be located at one or more logic dies 122 (e.g., in at a register file, a content addressable memory (CAM), cache, or other storage element). Alternatively, the storage array 334 may be implemented at least in part in a non-volatile memory (not shown), such as a flash memory, implemented in the die-stacked memory device 102. The QoS tracking metadata represents various memory utilization metrics for the sharers of the processing system 300. These memory utilization metrics can include, for example, a number or frequency of memory accesses performed by the memory controller 130 on behalf of a particular sharer or class of sharers (e.g., sharers of a certain type, a certain priority, or associated with a certain interface), for a particular type of memory access or certain priority of memory access, and the like.

In some embodiments, enforcement of QoS objectives is managed by an operating system, hypervisor or other component external to the die-stacked memory device 102. As the QoS manager 102 may be able to observe certain activities by the memory controller 130 that are impracticable to monitor by an external device, the QoS manager 102 can support QoS objectives by maintaining the QoS tracking metadata for use by this external QoS enforcement component. Accordingly, when the external QoS enforcement component seeks an update to memory utilization metrics, the external QoS enforcement component can issue a QoS configuration command 320 to the die-stacked memory device 120. The QoS configuration command 320 is routed to the QoS enforcement logic 332, and in response, the QoS enforcement logic 332 accesses the requested QoS tracking metadata from the storage array 334 and provides it to the memory controller 130 for transmission to the external QoS enforcement component as a response 322 to the QoS configuration command 320.

In other embodiments, enforcement of QoS objectives is primarily managed by the QoS manager 102. To this end, the QoS objectives to be enforced by the QoS manager 102 may be specified by storing configuration data to a configuration element 336, the coded values representing the QoS objectives to be implemented. The configuration data may be statically configured at design time or time of manufacture or field-deployment of the die-stacked memory device 102. Alternatively, the configuration data may be dynamically configured or updated during operation of the processing system 300. For example, an operating system or job management middleware executing at one of the external devices can issues a QoS configuration command 320 to store configuration data to the configuration element 336 to dynamically configure the QoS objectives to be implemented by the QoS enforcement logic 332 using the QoS tracking metadata.

The operations implemented by the QoS enforcement logic 332 depend on the QoS objectives to be enforced and the current or past history of memory access activity reflected in the QoS tracking metadata. To illustrate, to implement an equal bandwidth objective, the QoS enforcement logic 332 may determine from the QoS tracking metadata the number of memory accesses performed for each sharer within a sliding window of time and then manipulate the selection or order of memory access requests for processing to ensure that each sharer has a roughly equal number of memory accesses serviced within the sliding window. As another example, to implement an equal power consumption objective, the QoS enforcement logic 332 may determine from the QoS tracking metadata the number and type of memory accesses performed for each sharer within the sliding time window. From this information, the QoS enforcement logic 332 estimates the power consumption attributed to the sharer in the time window based on the power consumption attributable to each memory access performed for the sharer. The QoS enforcement logic 332 then manipulates the ordering or scheduling of subsequent memory access requests based on the issuing sharer and the type of memory access request to ensure that each sharer has a roughly equal share of the power consumed by the die-stacked memory device 102 within the sliding window. As yet another example, to implement a guaranteed maximum latency objective for a certain subset of the sharers, the QoS enforcement logic 332 may configure the memory controller 130 to one or more of: selectively reject memory access requests from sharers not in the subset, to prioritize memory access requests from sharers in the subset in the scheduled order of memory access requests to be processed by the memory controller 130, to reserve certain resources for sharers in the subset, and the like.

Figure 4:
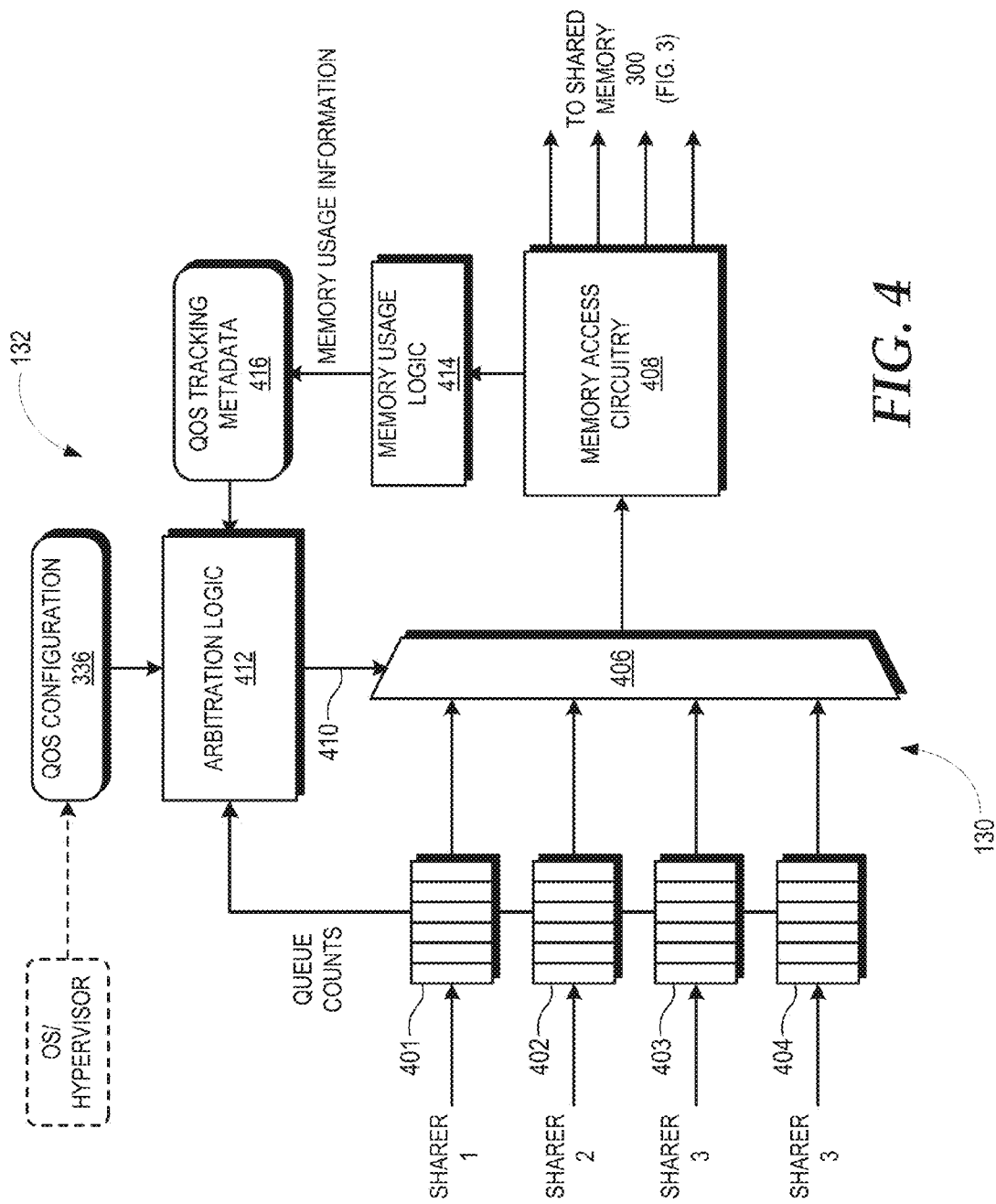
FIG. 4 is a diagram illustrating an example configuration of the QoS manager of the processing system of FIG. 1 in accordance with some embodiments.

FIG. 4 illustrates an example implementation of the QoS manager 132 in accordance with some embodiments. The memory controller 130 includes input queues 401, 402, 403, and 404, a multiplexer 406, and a memory access circuitry 408. The each of the input queues 401-404 buffers memory access requests from a corresponding sharer, identified as sharers 1-4, respectively. The multiplexer 406 includes a memory access request input coupled to each of the input queues 401-404, a selection input to receive a selection input 410, and an output to provide a memory access request from one of the input queues 401-404 selected based on the state of the selection input 410. The memory access circuitry 408 is coupled to the shared memory 301 (FIG. 3) and includes the line drivers, row buffers, sense amplifiers and other circuitry used to perform the memory access represented by a memory access request output by the multiplexer 406. Thus, the next memory access request to be processed by the memory controller 130 is selected based on manipulation of the selection input 410.

In the depicted example, the QoS manager 132 facilitates bandwidth-related QoS objectives through the ordering of processing of memory access requests received at the memory controller 130. To this end, the QoS manager 132 includes arbitration logic 412 and memory usage logic 414 (collectively comprising an example of the QOS enforcement logic 332 of FIG. 3) and QoS tracking metadata 416 stored in the storage array 334 (FIG. 3). The memory usage logic 414 monitors the activity of the memory access circuitry 408 to identify various information for memory accesses being performed, such as the type, requesting sharer, and the like. The memory usage logic 414 updates the memory utilization metrics represented by the QoS tracking metadata 416 in view of this information.

The arbitration logic 412 monitors the input queues 401-404 to obtain queue status information for the queues 401-404. Such status information can include, for example, the number of pending memory access requests in each queue (or the fullness of each queue), access types of the memory access requests queued in each queue, the ages of the memory access requests (i.e., how long has a particular request been waiting in the queue for service), and the like. For the example implementation described below, the arbitration logic 412 monitors the input queues 401-404 to obtain queue counts representing the fullness or numbers of queued memory access requests in the input queues 404-404, as well to obtain the priorities (if any) assigned by an OS or hypervisor to the corresponding sharers. However, approaches similar to those described below may be implemented for instances whereby other types of queue metrics are monitored and maintained by the arbitration logic 412. The arbitration logic 412 also monitors the memory utilization metrics represented by the QoS tracking metadata 416. Based on the queue counts, the memory access request priorities, the memory utilization metrics, and the QoS objectives specified by configuration data stored in the configuration element 336, the arbitration logic 412 manipulates the selection input 410 to affect the order or selection of memory access requests from the different sharers for servicing by the memory access circuitry 408.

To illustrate, the QoS objectives specified by the configuration data stored in the configuration element 336 may designate a balanced bandwidth approach that tries to provide fair bandwidth to each sharer by favoring the selection (via the selection input 410 and the multiplexer 406) the memory access requests from sharers who have recently received less overall bandwidth. In another example, the specified QoS objectives may designate an approach that balances demand (e.g., per sharer queue counts) with the bandwidth utilization and priority by computing a weighted score for each sharer and selecting one or more requests from the sharer with the highest score. An example of the computation of this score is represented by the following equation:

$$\text{score}(x) = \frac{a * \text{queue\_count}(x) + b * \text{priority}}{1 + \text{bandwidth\_used}}$$

where "score(x)" is the score computed for sharer "x", "queue_count(x)" is the current queue count for the sharer "x", "priority" is the priority assigned to sharer "x", "a" and "b" are the relative weights accorded to the queue count and priority metrics, respectively, and "bandwidth_used" is a measure of the recent bandwidth used by sharer "x". Under this approach, the selection of a sharer with a higher queue count becomes more urgent because the sharer has more pending memory access requests that need to be serviced. A sharer that is deemed to have a higher priority likewise will have a higher score count. A sharer that recently used excessive bandwidth will have a lower score and thus be deprioritized for selection to prevent the sharer from consuming an unfair portion of the overall bandwidth. A similar queue and multiplexer-based approach may be used to select memory access results for return to the requesting sharers.

Although FIG. 4 illustrates one example approach for implementing particular QoS objectives, any of a variety of QoS objectives may be implemented, as may the operations performed to facilitate these QoS objectives. As noted above, the QoS objectives may be based on the provision of certain latency-based objectives, bandwidth-based objectives, power-consumption based objectives, and the like. The operations performed to achieve these objectives can include manipulating the ordering or other scheduling of memory access requests or the return of results of memory access requests, the manipulation of reservations or occupancy limits for certain memory resources, the selective rejection of memory access requests from sharers, and the like. Regardless of the approach taken, the co-location and tight integration of the QoS manager 132 with the shared memory 301 of the die-stacked memory device 102 permits the QoS manager 132 to efficiently and effectively implement QoS objectives while enabling the external devices to focus their resources on other processes.

In at least one embodiment, the apparatus and techniques described above are implemented in a system comprising one or more integrated circuit (IC) devices (also referred to as integrated circuit packages or microchips), such as the die-stacked memory device 102 described above with reference to FIGS. 1-4. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 5:
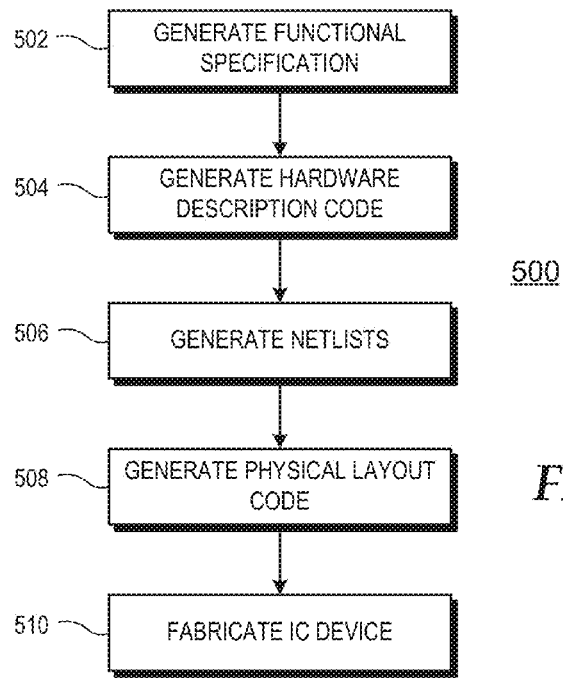
FIG. 5 is a flow diagram illustrating a method for designing and fabricating an integrated circuit (IC) device implementing a die-stacked memory device in accordance with some embodiments.

FIG. 5 is a flow diagram illustrating an example method 500 for the design and fabrication of an IC device implementing one or more aspects disclosed herein. As noted above, the code generated for each of the following processes is stored or otherwise embodied in computer readable storage media for access and use by the corresponding design tool or fabrication tool.

At block 502 a functional specification for the IC device is generated. The functional specification (often referred to as a micro architecture specification (MAS)) may be represented by any of a variety of programming languages or modeling languages, including C, C++, SystemC, Simulink™, or MATLAB™.

At block 504, the functional specification is used to generate hardware description code representative of the hardware of the IC device. In at least one embodiment, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 506 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 508, one or more EDA tools use the netlists produced at block 506 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 510, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An integrated circuit (IC) device comprising:
a set of one or more stacked memory dies implementing memory cell circuitry; and
a set of one or more logic dies electrically coupled to the memory cell circuitry, the set of one or more logic dies comprising a quality-of-service (QoS) manager and a memory controller, the memory controller coupled to the QoS manager and coupleable to a set of one or more devices sharing access to the set of one or more stacked memory dies, and the QoS manager to perform operations for a specified QoS objective.

2. The IC device of claim 1, further comprising:
a storage array to store QoS tracking metadata representing memory utilization metrics for the set of one or more stacked memory dies; and
wherein the QoS manager is to monitor the memory controller to update the QoS tracking metadata responsive to memory access requests serviced by the memory controller.

3. The IC device of claim 2, wherein:
the specified QoS objective comprises maintaining the QoS tracking metadata on behalf of a select device of the set of one or more devices; and
the QoS manager is to perform an operation to transmit at least a portion of the QoS tracking metadata to the select device responsive to a request received from the select device.

4. The IC device of claim 2, wherein the QoS tracking metadata includes at least one of: a bandwidth metric on at least one of a per-sharer basis, a per-sharer-class basis, a per-device basis, a per-device-class basis, a per-interface basis, and a per-access-type basis; a latency metric on at least one of a per-sharer basis, a per-sharer-class basis, a per-device basis, a per-device-class basis, a per-interface basis, and a per-access-type basis; and a power consumption metric on at least one of a per-sharer basis, a per-sharer-class basis, a per-device basis, a per-device-class basis, a per-interface basis, and a per-access-type basis.

5. The IC device of claim 1, wherein the QoS manager is to arbitrate access to the set of one or more stacked memory dies among sharers of the set of one or more stacked memory dies based on the specified QoS objective.

6. The IC device of claim 5, wherein the specified QoS objective comprises at least one of: an equal bandwidth allocation among at least a subset of the sharers; a minimum bandwidth for a subset of the sharers; a minimum average access latency for at least a subset of the sharers; a maximum access throughput for at least a subset of the sharers; a maximum access latency for a subset of the sharers; and an equal power consumption among at least a subset of the sharers.

7. The IC device of claim 5, wherein the specified QoS objective comprises at least one of: a minimum bandwidth for a specified type of memory access; a minimum average access latency for a specified type of memory access; a maximum access throughput for a specified type of memory access; and a maximum access latency for a specified type of memory access.

8. The IC device of claim 5, wherein the QoS manager is to arbitrate access by managing an order of memory access requests to be serviced by the memory controller.

9. The IC device of claim 5, wherein the QoS manager is to arbitrate access through selective rejection of memory access requests from the set of devices.

10. The IC device of claim 5, wherein the QoS manager is to arbitrate access by managing an order in which memory access results are returned to the sharers.

11. The IC device of claim 5, wherein the QoS manager is to arbitrate access by selectively reserving resources of the IC device for use in servicing memory access requests.

12. The IC device of claim 5, wherein the QoS manager comprises:
   a multiplexer having a plurality of memory access request inputs, an output, and a selection input, each memory access request input coupled to an output of a corresponding memory access request queue of a plurality of memory access request queues, and the output coupled to an input of the memory controller; and
   arbitration logic having an input to receive queue status information for each memory access request queue, an input to receive QoS tracking metadata representing a memory utilization history for the sharers, an input to receive control data representative of the specified QoS objective, and an output coupled to the selection input of the multiplexer, wherein the arbitration logic is to configure its output to control the multiplexer to provide a memory access request from a selected one of the plurality of memory access request queues to the memory controller for servicing, the selected one of the plurality of memory access request queues selected based at least in part on the queue status information, the QoS tracking metadata, and the specified QoS objective.

13. The IC device of claim 1, wherein the set of one or more stacked memory dies and the set of one or more logic dies are disposed in a stacked configuration whereby the memory controller is connected to the stacked memory dies via a set of through silicon vias.

14. The IC device of claim 1, wherein the set of one or more stacked memory dies and the set of one or more logic dies are disposed in a side-split arrangement whereby the memory controller is connected to the set of one or more stacked memory dies via an interposer.

15. A method comprising:
   operating an integrated circuit (IC) device to perform memory access requests for one or more devices of a set of devices external to the IC device, the IC device comprising a set of one or more stacked memory dies comprising memory cell circuitry and comprising a set of one or more logic dies electrically coupled to the set of one or more stacked memory dies, the set of one or more logic dies comprising a quality of service (QoS) manager coupled to the memory cell circuitry of the set of one or more stacked memory dies and comprising a memory controller coupled to the QoS manager and coupled to the one or more devices; and
   operating the QoS manager to perform operations for a specified QoS objective.

16. The method of claim 15, wherein operating the QoS manager comprises operating the QoS manager to arbitrate access to the set of one or more stacked memory dies among sharers of the set of one or more stacked memory dies based on the specified QoS objective.

17. The method of claim 16, wherein operating the QoS manager to arbitrate access comprises operating the QoS manager to arbitrate access by managing an order of memory access requests to be serviced by the memory controller.

18. The method of claim 16, wherein operating the QoS manager to arbitrate access comprises operating the QoS manager to arbitrate access through selective rejection of memory access requests from the set of devices.

19. The method of claim 16, wherein operating the QoS manager to arbitrate access comprises operating the QoS manager to arbitrate access by managing an order in which memory access results are returned to the sharers.

20. The method of claim 16, wherein operating the QoS manager to arbitrate access comprises operating the QoS manager to arbitrate access by selectively reserving resources of the IC device for use in servicing memory access requests.

21. The method of claim 16, further comprising:
   operating a plurality of memory access request queues to receive a plurality of memory access requests;
   operating a multiplexer of the IC device to select between the plurality of memory access request queues for output to an input of the memory controller; and
   operating arbitration logic of the IC device to control the multiplexer to output a memory access request from a selected one of the plurality of memory access request queues to the memory controller for servicing, the selected one of the plurality of memory access request queues selected based at least in part on queue status information for each of the plurality of memory access request queues, the QoS tracking metadata representing a memory utilization history for the sharers, and the specified QoS objective.

22. A non-transitory computer readable medium storing code which is operable to manipulate at least one computer system to perform a portion of a process to fabricate an integrated circuit (IC) device, the IC device comprising:
   a set of one or more stacked memory dies implementing memory cell circuitry; and
   a set of one or more logic dies electrically coupled to the memory cell circuitry, the set of one or more logic dies comprising a quality-of-service (QoS) manager and a memory controller, the memory controller coupled to the QoS manager and coupleable to a set of one or more devices sharing access to the set of one or more stacked memory dies, and the QoS manager to perform operations for a specified QoS objective.

23. The non-transitory computer readable medium of claim 22, wherein the IC device further comprises:
   a storage array to store QoS tracking metadata representing memory utilization metrics for the set of one or more stacked memory dies; and wherein the QoS manager is to monitor the memory controller to update the QoS tracking metadata responsive to memory access requests serviced by the memory controller.

24. The non-transitory computer readable medium of claim 22, wherein the QoS manager is to arbitrate access to the set of one or more stacked memory dies among sharers of the set of one or more stacked memory dies based on the specified QoS objective.

* * * * *